US010229750B2

(12) United States Patent
Patel et al.

(10) Patent No.: US 10,229,750 B2
(45) Date of Patent: Mar. 12, 2019

(54) MEMORY MANAGEMENT ARCHITECTURE FOR USE WITH A DIAGNOSTIC TOOL

(71) Applicant: Bank of America Corporation, Charlotte, NC (US)

(72) Inventors: Akshay Patel, Cary, NC (US); Kanika Vij, Charlotte, NC (US)

(73) Assignee: Bank of America Corporation, Charlotte, NC (US)

( * ) Notice: Subject to any disclaimer, the term of this patent is extended or adjusted under 35 U.S.C. 154(b) by 0 days.

(21) Appl. No.: 15/409,118

(22) Filed: Jan. 18, 2017

(65) Prior Publication Data

US 2018/0204593 A1    Jul. 19, 2018

(51) Int. Cl.

| G11C 29/00 | (2006.01) |
|---|---|
| G11C 29/56 | (2006.01) |
| G11B 27/36 | (2006.01) |
| G11C 29/48 | (2006.01) |
| G11C 29/50 | (2006.01) |
| G11C 29/44 | (2006.01) |
| G06F 12/08 | (2016.01) |
| G06F 11/00 | (2006.01) |
| G06F 9/455 | (2018.01) |
| G06F 11/07 | (2006.01) |
| G11B 20/18 | (2006.01) |

(52) U.S. Cl.
CPC .............. *G11C 29/56* (2013.01); *G06F 11/00* (2013.01); *G06F 12/08* (2013.01); *G11B 27/36* (2013.01); *G11C 29/44* (2013.01); *G11C 29/48* (2013.01); *G11C 29/50* (2013.01); *G06F 11/073* (2013.01); *G06F 2009/45583* (2013.01); *G11B 20/1816* (2013.01)

(58) Field of Classification Search
CPC ......... G06F 11/073; G06F 2009/45583; G11B 20/1816; G11B 27/36; G11C 29/56; G11C 29/48; G11C 29/44; G11C 29/50
USPC ................................ 714/718, 719, 763, 766
See application file for complete search history.

(56) References Cited

U.S. PATENT DOCUMENTS

| 6,327,594 | B1 * | 12/2001 | Van Huben ....... G06F 17/30348 |
|---|---|---|---|
| 6,775,824 | B1 | 8/2004 | Osborne, II et al. |
| 6,934,934 | B1 | 8/2005 | Osborne, II et al. |
| 7,000,224 | B1 | 2/2006 | Osborne, II et al. |
| 7,673,179 | B2 | 3/2010 | LaBanca et al. |

(Continued)

*Primary Examiner* — Esaw T Abraham
*Assistant Examiner* — Osman M Alshack
(74) *Attorney, Agent, or Firm* — Weiss & Arons LLP; Michael A. Springs, Esq.

(57) ABSTRACT

A memory management architecture in a testing environment including a memory cache and a hard drive is provided. The hard drive may be configured to receive a high-volume set of production data including computer-readable spreadsheet files in varied file formats. The memory cache comprised in the memory management architecture may be configured to receive and store from the hard drive a first subset of the high-volume set of production data. This form of retrieval allows for not having to receive from off-site or from an external source. The memory management architecture may also include a diagnostic tool that may be used for data analysis. The diagnostic tool may analyze and test the fields listed on the field list, for any errors and/or omissions. When the data analysis and testing is complete, the diagnostic tool may then generate a data analysis summary report based on the analysis.

24 Claims, 9 Drawing Sheets

(56) References Cited

U.S. PATENT DOCUMENTS

| | | | |
|---|---|---|---|
| 7,694,181 B2 | 4/2010 | Noller et al. | |
| 8,060,483 B2 | 11/2011 | Haub et al. | |
| 8,386,419 B2 | 2/2013 | Yalamanchilli | |
| 8,621,434 B2 | 12/2013 | Campion et al. | |
| 9,021,443 B1 | 4/2015 | Lachwani et al. | |
| 9,122,460 B2 | 9/2015 | Williamson | |
| 9,262,193 B2 | 2/2016 | Hicks et al. | |
| 2005/0257132 A1* | 11/2005 | Karby | G06F 17/246 715/213 |
| 2006/0059253 A1* | 3/2006 | Goodman | G06Q 10/06 709/223 |
| 2009/0083325 A1 | 3/2009 | Belide et al. | |
| 2010/0036872 A1* | 2/2010 | Hiraiwa | G06F 17/3012 707/E17.055 |
| 2010/0186004 A1* | 7/2010 | Will | G06F 17/30525 717/131 |
| 2011/0313975 A1* | 12/2011 | Landauer | G06F 11/073 707/687 |
| 2012/0197887 A1* | 8/2012 | Anderson | G06F 17/30321 707/736 |
| 2013/0173539 A1* | 7/2013 | Gilder | G06F 17/30578 707/622 |
| 2014/0006342 A1* | 1/2014 | Love | G06F 17/30345 707/609 |
| 2014/0359283 A1* | 12/2014 | Lee | H04L 67/2852 713/165 |
| 2017/0262816 A1* | 9/2017 | Furihata | G06Q 10/06 |

* cited by examiner

MEMORY MANAGEMENT ARCHITECTURE FOR USE WITH A DIAGNOSTIC TOOL

FIELD OF TECHNOLOGY

This invention relates to data integrity in a testing environment. In particular, this invention relates to data integrity in a testing environment utilizing a memory management architecture.

BACKGROUND OF THE DISCLOSURE

Large migration projects utilize testing environments for the handling of exceedingly high volumes of data. Handling the data may include producing files for raw data comparison, testing and validation. Testing environments in the areas of data mapping, raw data comparison and format-related coverage may process a high volume of data. This high volume of data may increase the complexity of administrating such environments. Specifically, administrating high volumes of data may produce a high number of defects related to the data, high costs of execution and analysis, slower systems, and may be very time-consuming.

Additionally, due to the high volumes of data, the system may run out of memory cache and the system may crash and a test may not be performed.

Therefore, it may be desirable to have a memory management system that can manage high volumes of data while maintaining data integrity, validating varied formats and optimizing field coverage in a testing environment.

SUMMARY OF THE INVENTION

Aspects of the invention relate to utilizing a memory management architecture to preserve data integrity in a testing environment. According to certain embodiments a memory management architecture may include a memory cache and a hard drive. The memory cache and the hard drive may be configured to preferably receive, simultaneously, a first set of production data. In receiving the first set of production data simultaneously, as oppose to serially, this enables the saving of unnecessary excess of time and the avoidance of writing from an external source to the hard-drive and then subsequently to the memory cache.

Following the receipt of the first set of production data, the first set of production data may be stored on the memory cache and on the hard drive. The first set of production data may be used for analysis and testing in a testing environment.

The memory management architecture may also include a diagnostic tool that may be used for data analysis of the first set of production data that is stored on the memory cache.

Prior to the analysis and testing of the first set of production data, the diagnostic tool may allow for test format specification input. The test format specification input may be user-defined or system set.

The test format specification input may be specified on a format specification type document and the diagnostic tool may then retrieve the format specification document and based on the format specification input, may then generate a field list appropriately. The field list may include a specific list of fields to be tested from the plurality of lists from the first set of production data.

The diagnostic tool may analyze and test the field list in a testing environment for any errors and/or omissions.

When the data analysis and testing is complete, the diagnostic tool may then generate a data analysis summary report based on the analysis of the first set of production data.

BRIEF DESCRIPTION OF THE DRAWINGS

The objects and advantages of the invention will be apparent upon consideration of the following detailed description, taken in conjunction with the accompanying drawings, in which like reference characters refer to like parts throughout, and in which:

FIG. 2 shows an illustrative spreadsheet that includes data according to certain embodiments.

FIG. 3 shows an illustrative spreadsheet that includes data according to certain embodiments.

DETAILED DESCRIPTION OF THE DISCLOSURE

Figure 1:
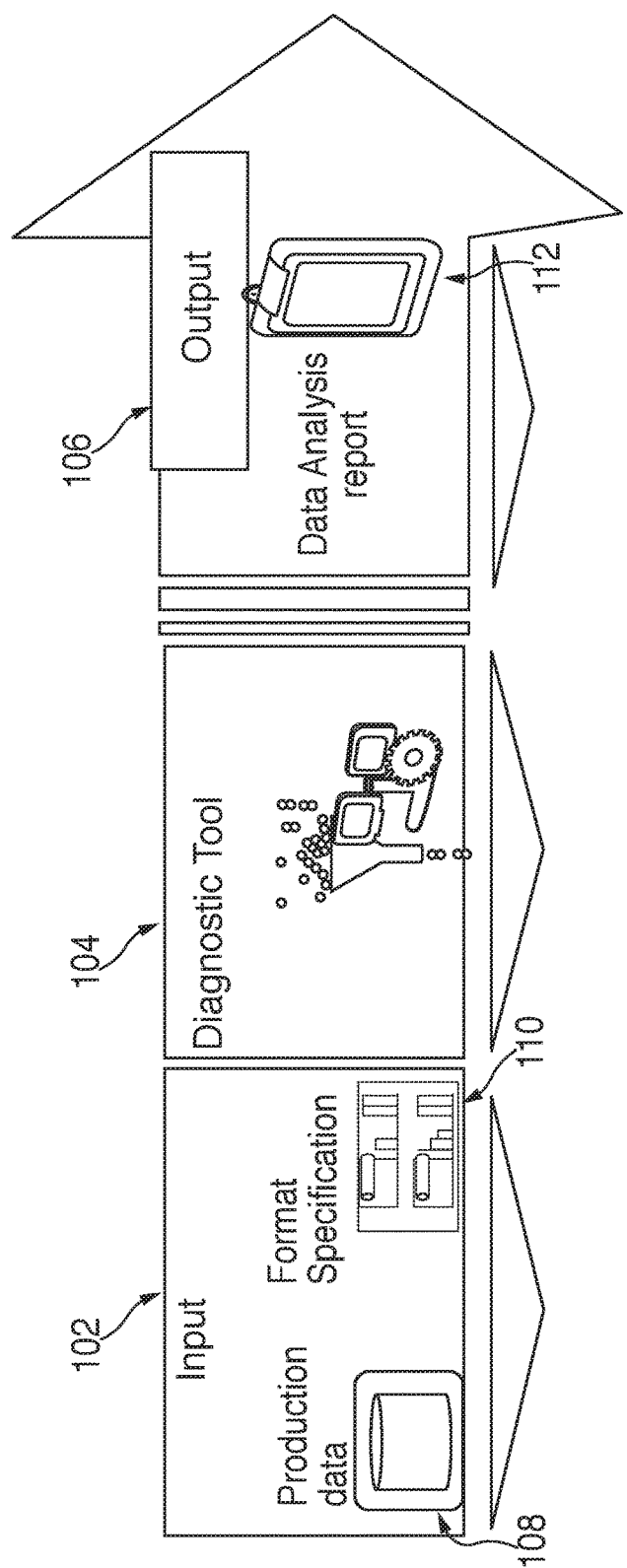
FIG. 1 shows an illustrative diagram according to certain embodiments.

A memory management architecture is provided. In certain embodiments, a memory management architecture may include a memory cache and a hard drive. The memory cache and the hard drive may be configured to preferably receive simultaneously a first set of production data. In receiving the first set of production data preferably, simultaneously as oppose to serially, this enables the saving of processing time. Processing time is saved because this memory management process avoids writing from an external data source to the hard drive and then writing from the hard drive to the memory cache. The first set of production data may include computer-readable spreadsheet files. Each of the spreadsheet files may be instantiated in an associated spreadsheet file format.

Following the receipt of the first set of production data, the first set of production data may be stored on the memory cache and on the hard drive. The first set of production data may be used for analysis and testing in a testing environment.

The memory management architecture may also include a diagnostic tool that may be used for data analysis of the first set of production data that is stored on the memory cache.

Prior to the analysis and testing of the first set of production data, the diagnostic tool may allow for test format specification input. The test format specification input may be user-defined or system set.

The test format specification input may be specified on a format specification type document and the diagnostic tool may then retrieve the format specification document and, based on the format specification input, may then generate an appropriate field list. The field list may include a specific list of fields to be tested. The field list may be derived from the plurality of lists contained within the first set of production data.

Many different test format specifications may be inputted to the test format specification document. A set number of field types from the plurality of fields on the first set of production data may be defined on the test format specification document. This specification may condense the amount of data that may be tested and analyzed.

Specific field types from the plurality of fields to test, may also be defined on the test format specification document. This specification may narrow the multitudes of field types that may be tested and analyzed.

File and/or message format type may also be specified on the test format specification document. This may enable the diagnostic tool to generate a field list to conform to the file and/or message format type. The file and/or message format types may include at least one of SWIFT, XML and/or FIX.

Furthermore, the test format specification documents may allow for input regarding specifying a specific segment from the plurality of fields. When specifying the segment, a start point and an end point of data entries may be entered and the diagnostic tool may then analyze and test only the specified segments. This specification may simplify and narrow the plurality of fields being tested.

Following user-defined or system set test format specification input on a test format specification document, the diagnostic tool may then retrieve the test format specification document. The diagnostic tool may then check for the file and/or message file type entered on the test format specification document and process the test format specification input. Based on the file and/or message file type, and based on the specifications set in the test format specification document, the diagnostic tool may generate the field list of fields to be tested from the first set of production data accordingly.

The field list generated is in preparation for the data analysis. The data analysis may include analyzing the specified fields set on the field list from the plurality of fields in the production data, for errors and/or omissions.

The diagnostic tool may present the field list in a user-friendly format. Furthermore, the field list may define the fields tested as either a "mandatory" field for analysis, or as an "optional" field for analysis. These descriptions may contribute to the efficiency and success of the data testing.

The diagnostic tool may analyze and test the field list in a testing environment for any errors and/or omissions.

When the data analysis and testing is complete, the diagnostic tool may then generate a data analysis summary report based on the analysis of the first set of production data.

Following completion of the generating of the data analysis summary report of the first set of production data, the memory cache and hard drive may be configured to receive preferably simultaneously, a second set of production data.

The second set of production data may overwrite the first set of production data in the memory cache and then may be stored in the memory cache. Preferably simultaneously, the second set of production data may be stored in the hard drive while maintaining the first set of production data in the hard drive for future use.

The second set of production data may include computer-readable spreadsheet files. Each of the spreadsheet files may be instantiated in an associated spreadsheet file format.

Prior to the analysis and testing of the second set of production data, the diagnostic tool may be configured to allow for test format specification input. The test format specification input may be entered on a format specification document. The format specification document may contain different test format specifications. The test format specifications may be the same specifications described previously in the first set of production data.

Following test format specification input on a test format specification document, the diagnostic tool may then retrieve the test format specification document. The diagnostic tool may then check for the file and/or message file type entered on the test format specification document and process the test format specification input. Based on the file and/or message file type, and based on the specifications set in the test format specification document, the diagnostic tool may generate a second field list of fields to be tested from the second set of production data accordingly.

The second field list generated is in preparation for the data analysis. The data analysis may include analyzing the specified fields set on the second field list from the plurality of fields in the second set production data, for errors and/or omissions.

The second field list generated may then be analyzed and tested in a testing environment for any errors and/or omissions.

When the data analysis and testing is complete, the diagnostic tool may then generate a data analysis summary report based on the analysis of the second set of production data.

In other embodiments, a memory management architecture may include a memory cache and a hard drive. The hard drive may be configured to receive a high-volume set of production data. The high-volume set of production data may include computer-readable spreadsheet files wherein each of the spreadsheet files may include an associated spreadsheet file format.

The memory cache included in the memory management architecture may be configured to receive from the hard drive a first subset of the high-volume set of production data. In receiving directly from the hard-drive, this form of receiving allows for not having to receive from off-site or from an external source.

The first subset of the high-volume set of production data may then be stored on the memory cache.

The memory management architecture may also include a diagnostic tool that may be used for data analysis of the first subset of production data that may be stored on the memory cache.

Prior to the analysis and testing of the first subset of high-volume production data, the diagnostic tool may allow for test format specification input. The test format specification input may be user-defined or system set.

The test format specification input may be specified on a test format specification type document and the diagnostic tool may then retrieve the test format specification document and based on the test format specification input, may then generate a field list appropriately. The field list may include a specific list of fields to be tested and analyzed from the plurality of lists of fields from the first subset of high-volume production data.

Many different specifications may be entered to the test format specification document. A set number of field types to test from the plurality of fields on the first subset of high-volume production data may be defined on the test format specification document. This specification may condense the amount of data that may be tested and analyzed.

Specific field types from the plurality of fields to test, may also be defined on the test format specification document.

This specification may narrow the multitudes of field types that may be tested and analyzed.

File and/or message format type may also be specified on the test format specification document enabling the diagnostic tool to generate a field list to conform to the file and/or message format type. The file and/or message format types may include at least one of SWIFT, XML and/or FIX.

Furthermore, the format specification documents may allow for input regarding specifying a specific segment from the plurality of fields. When specifying the segment, a start point and end point of data entries may be entered and the diagnostic tool may then analyze and test only the specified segments. This specification may simplify and narrow the plurality of fields being tested.

Following user-defined or system set test format specification input on a test format specification document, the diagnostic tool may then retrieve the test format specification document. The diagnostic tool may then check for the file and/or message file type entered on the test format specification document and process the test format specification input. Based on the file and/or message file type, and based on the specifications set in the test format specification document, the diagnostic tool may generate the field list for the first subset of production data accordingly.

The field list generated is in preparation for the data analysis. The data analysis may include analyzing the specified fields that are set on the field list from the plurality of fields in the production data of the first subset of production data, for errors and/or omissions.

The diagnostic tool may present the field list in a user-friendly format. Furthermore, the field list may define the fields tested as either a "mandatory" field for analysis, or as an "optional" field for analysis. These descriptions may contribute to the efficiency and success of the data testing.

The diagnostic tool may analyze and test the fields listed on the field list, in a testing environment, for any errors and/or omissions.

When the data analysis and testing is complete, the diagnostic tool may then generate a data analysis summary report based on the analysis of the first subset of production data.

Following completion of generating the data analysis summary report of the first subset of production data, the memory cache may be configured to receive a second subset of production data from the high-volume set of production data stored on the hard drive. The second subset of production data may be different from the first subset of production data.

The second subset of production data may overwrite the first subset of production data on the memory cache and may then be stored on the memory cache.

The second subset of production data may include computer-readable spreadsheet files. Each of the spreadsheet files may be instantiated in an associated spreadsheet file format.

Prior to the analysis and testing of the second subset of production data, the diagnostic tool may be configured to allow for test format specification input. The test format specification input may be entered on a test format specification document. The test format specification document may contain different test format specifications. The test format specifications may be the same specifications described previously in the first subset of production data.

Following test format specification input on a test format specification document, the diagnostic tool may then retrieve the test format specification document. The diagnostic tool may then check for the file and/or message file type entered on the test format specification document and process the test format specification input. Based on the file and/or message file type, and based on the specifications set in the test format specification document, the diagnostic tool may generate a second field list of fields to be tested from the second subset of production data accordingly.

The second field list generated is in preparation for the data analysis. The data analysis may include analyzing the specified fields set on the second field list from the plurality of fields in the second subset production data, for errors and/or omissions.

The second field list generated may then be analyzed and tested in a testing environment for any errors and/or omissions.

When the data analysis and testing is complete, the diagnostic tool may then generate a data analysis summary report based on the analysis of the second subset of high volume production data.

The second field list generated may then be analyzed and tested in a testing environment for any errors and/or omissions.

When the data analysis and testing is complete, the diagnostic tool may then generate a data analysis summary report based on the analysis of the second subset of high volume production data.

Apparatus and methods described herein are illustrative. Apparatus and methods in accordance with this disclosure will now be described in connection with the figures, which form a part hereof. The figures show illustrative features of apparatus and method steps in accordance with the principles of this disclosure. It is to be understood that other embodiments may be utilized and that structural, functional and procedural modifications may be made without departing from the scope and spirit of the present disclosure.

The steps of methods may be performed in an order other than the order shown and/or described herein. Embodiments may omit steps shown and/or described in connection with illustrative methods. Embodiments may include steps that are neither shown nor described in connection with illustrative methods.

Illustrative method steps may be combined. For example, an illustrative method may include steps shown in connection with another illustrative method.

Apparatus may omit features shown and/or described in connection with illustrative apparatus. Embodiments may include features that are neither shown nor described in connection with the illustrative apparatus. Features of illustrative apparatus may be combined. For example, an illustrative embodiment may include features shown in connection with another illustrative embodiment.

FIG. 1 shows an illustrative diagram according to certain embodiments. Input layer 102 displays the input types the diagnostic tool may be configured to receive and process. Production data 108 may include the data from the production. The data may be single or multiple files of the same format. Format specification 110 may be a mapping document. The mapping document may provide field level details for each file and/or message format type and may be different for each interface and/or client. Diagnostic tool 104 may generate input 102 by retrieving the test format specification document 110, generating the field list and then may review and analyze production data 108 in each field on format specification document 110 for errors and/or omissions. In output layer 106, diagnostic tool 104 may generate a data analysis report 106 encompassing details from the analysis. The details on the data analysis report 112 may state the number of times a field was tested. The data analysis report 112 may also include whether the fields tested were mandatory or optional fields to be tested. The data analysis report 112 may further include business rule validation engine such as boundaries, format validation, BIC codes and EFT codes. The data analysis report 112 may also include variations of data used in each field.

Figure 2:
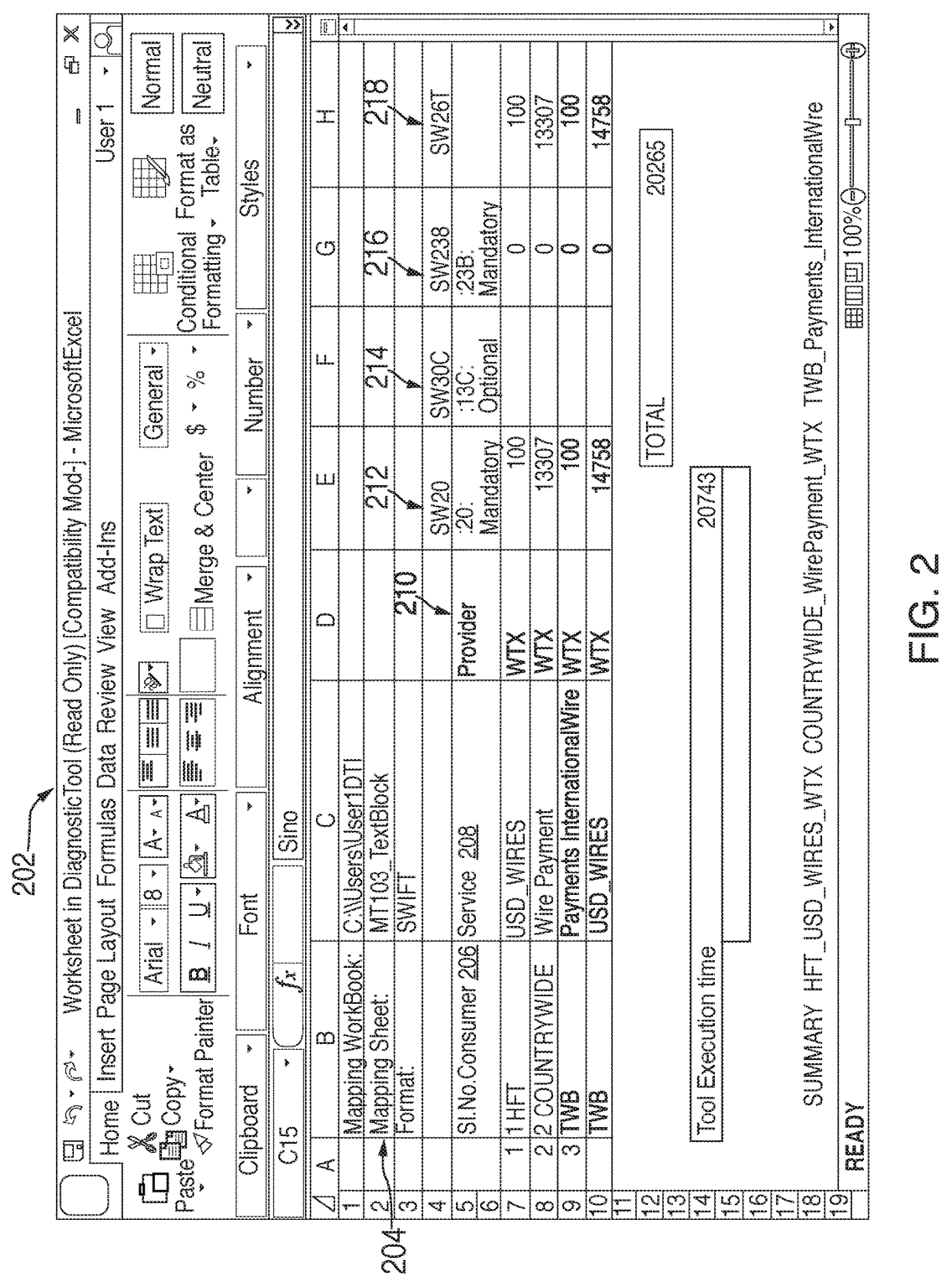

FIG. 2 shows an illustrative spreadsheet that includes production data according to certain embodiments. Spreadsheet 202 may be a first set or a second set of production data for testing and analysis. Data entries 204 may specify the file and/or file message format type of production data set forth.

The consumer type column 206 may be the beneficiary of the service being provided. Specifically, a SWIFT payment as shown at 204. A consumer may be a line of business within an entity or an internal entity within an entity. A consumer may also be an external entity.

Service type column 208 is a provision given from one entity to another entity. Examples of a service may be a payment, a wire payment, a check, an ACH or any other suitable payment service. A service may be a SWIFT payment as shown above at 204. Provider type column 210 may identify the source of the file.

Provider type column 210 may be the provider of a service which is being provided. In this illustrative spreadsheet 202 where the format is type SWIFT, a provider may be the financial benefactor or any other sort of provider or giver of the financial exchange. The provider 210 may be a sub-entity within an entity. The provider may be an external entity to the base entity. The provider may be the entity itself. Furthermore, the provider may be any other sort of entity.

Column 212 may be a field included in a SWIFT payment format. The data displayed in column 212 may be mandatory according to SWIFT procedures while other columns may be optional.

Column 214 may be another field included in a SWIFT payment format. The data displayed in column 214 may be optional according to SWIFT procedures while other columns may be mandatory.

Column 216 may be another field included in a SWIFT payment format. The data displayed in column 214 may be optional according to SWIFT procedures while other columns may be mandatory.

Column 218 may be another field included in a SWIFT payment format. The data displayed in column 214 may be optional according to SWIFT procedures while other columns may be mandatory.

The optionality of columns 212-218 may be determined by the SWIFT procedures and rules. The optionality of the columns may be determined by the kind of SWIFT document being sent and/or by the provider location information or consumer location information or any other suitable information.

Figure 3:
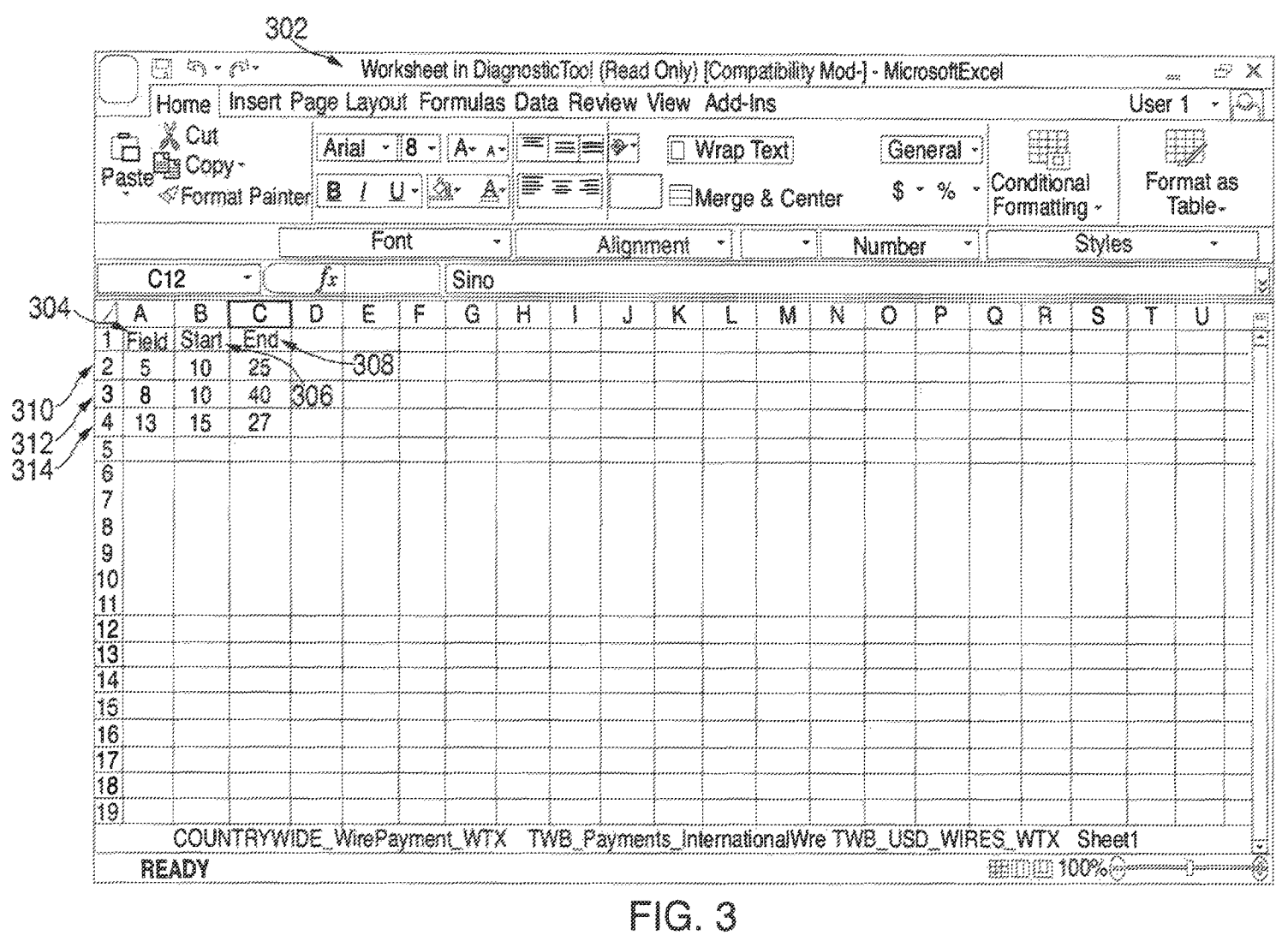

FIG. 3 displays a spreadsheet file. Spreadsheet file 302 may display a sample of a test specification inputted to the format specification document. Field column type 304 may display the number of the field type that may be used for testing. Start column type 306 may display the position at which the diagnostic tool may start the testing. End column type 308 may display the position at which the diagnostic tool may conclude the testing.

Defining these options under data column types 304-308 may enable the diagnostic tool to only analyze and test those specified segments. Specifications set at spreadsheet file 302 may allow for simplification and narrowing of the plurality of fields being tested and may also allow for a decrease in the occurrence of errors that may occur in a testing environment.

Examples of this test specification is seen at entry lines 310-314. For example, data entry line 310 may define the specific field to be tested and set a start position and end position in that specified field. At entry line 310, field 5 is specified to be tested and is setting a starting position at data entry 10 of field 5 and an end position at data entry 25 of field 5.

Figure 4:
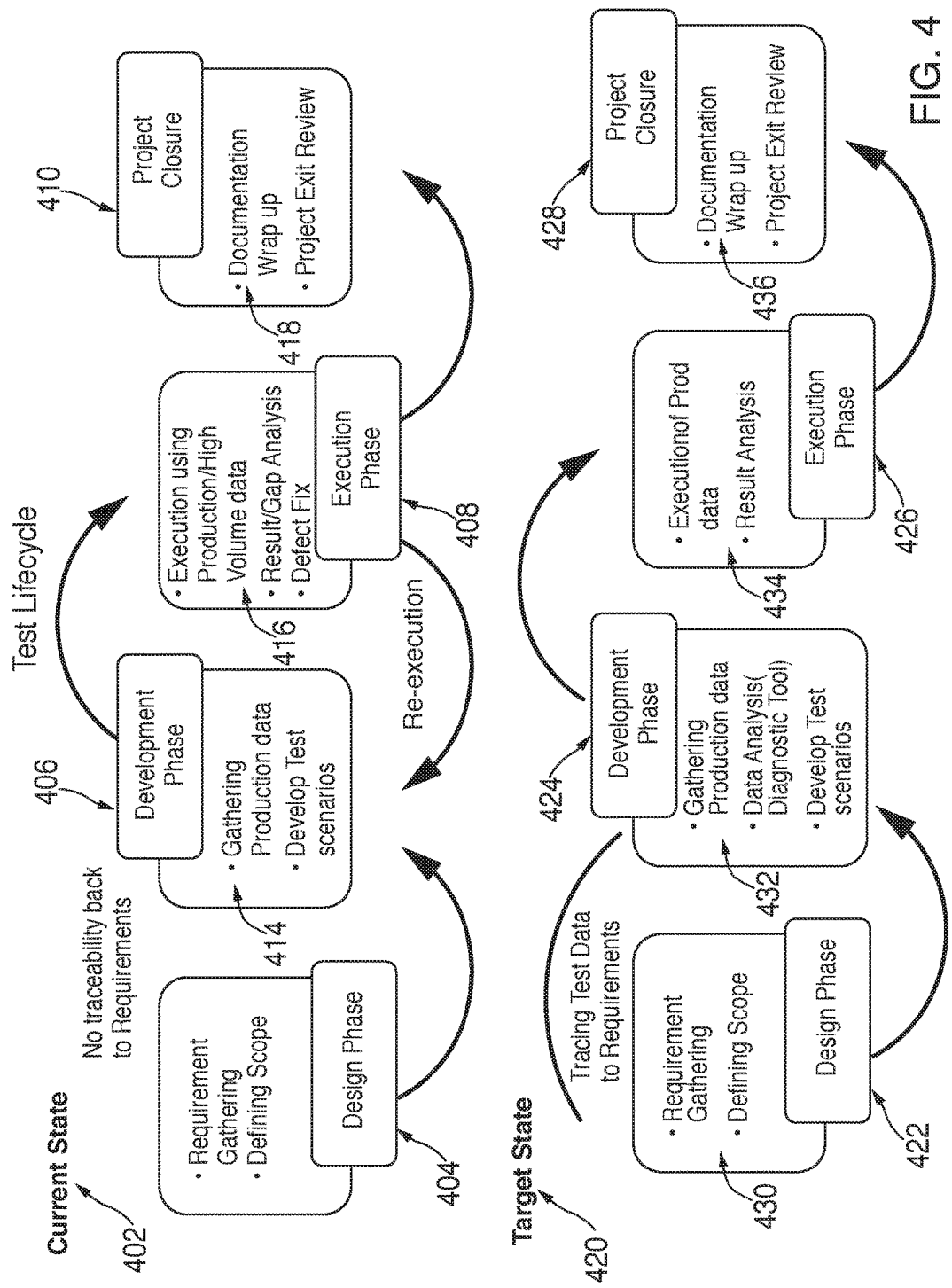
FIG. 4 shows an illustrative diagram according to certain embodiments.

FIG. 4 shows an illustrative diagram according to certain embodiments. Context of a test lifecycle are illustrated. Current state 402 is a conventional diagram of a test lifecycle. In design phase 404, the requirements for testing are gathered and the scope of the testing is defined.

Upon conclusion of the design phase 404, development phase 406 follows. During development phase 406, high volume data is gathered and test scenarios are developed. The termination of which data and the specification of the fields to be tested take place in development phase 406.

In this conventional diagram 402, there is no option of tracing back the test data during the development phase 406 to the original requirements that were set in design phase 404.

Execution phase 408 is the next level in the conventional test lifecycle. Data that was specified for testing during the development phase is now tested and the results are established and executed. In a case where a defect is found in the testing data during the execution process, the data needs to be re-tested and executed as shown at 410.

Following confirmation that all testing and executing was successful, project closure phase 412 may follow. The testing of the data is completed and the project is closed.

In target state 414, a test lifecycle diagram according to certain embodiments is shown. In design phase 416, the requirements for testing are gathered and the scope of the testing is defined.

Upon conclusion of design phase 416, development phase 418 follows. During development phase 418, high volume data that will be used in the production are gathered and test scenarios are developed. The deciding of which data and the specifying of the fields to be tested take place in development phase 418. Developing test scenarios may be implemented by specifying the segment of data, from among the total data production, to be tested. Another example of test scenarios that may be established is specifying specific fields from among the total fields, to be tested.

In these embodiments of a test lifecycle, the diagnostic tool is used for data analysis, and any defect or error in the data may be detected during this phase and preferably corrected. The diagnostic tool may eliminate the re-execution of the production data that was necessary in the conventional test lifecycle 402.

Another option according to certain embodiments may be that during development phase 418, the data to be tested may be traced back, and compared with the original requirements at design phase 416.

Execution phase 420 is the next level in the test lifecycle. Data that was specified for testing during development phase 418 is now tested and the results are established and executed. Project closure phase 422 may follow and the documentation is concluded and the project is complete.

Figure 5A:
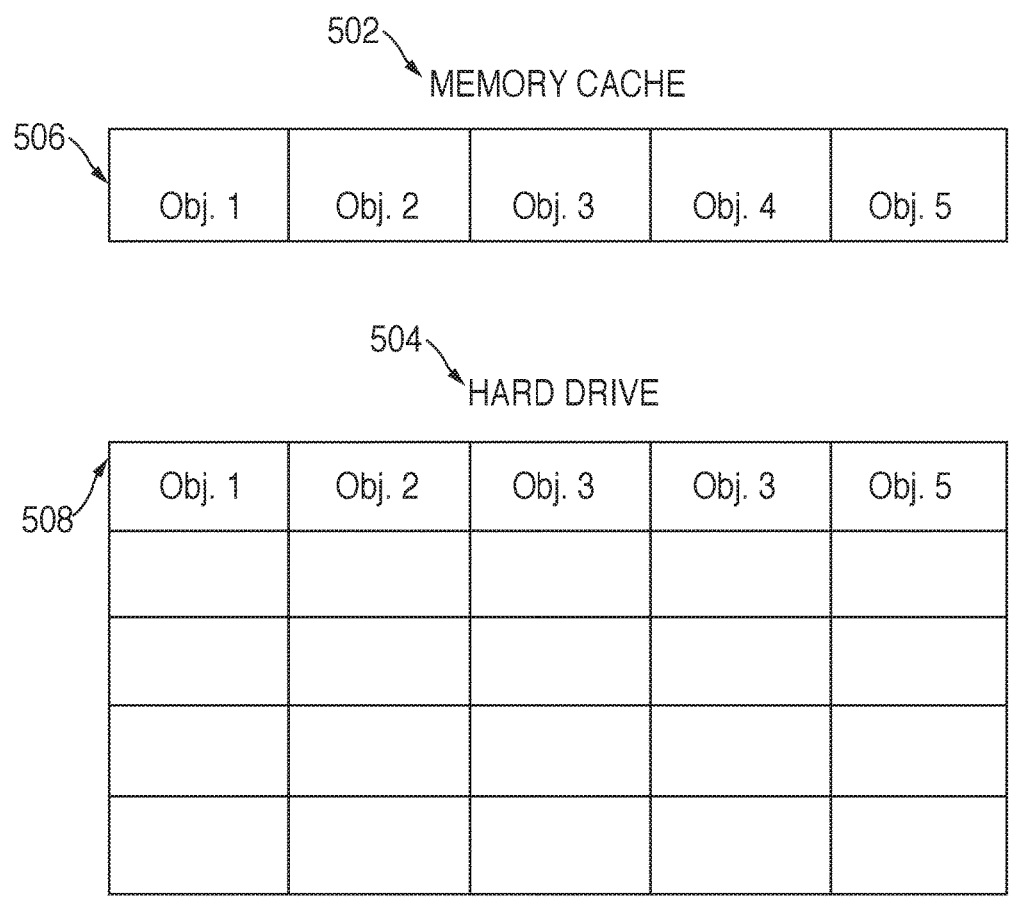
FIG. 5A shows a schematic diagram of a memory architecture in a first state according to certain embodiments.

FIG. 5A shows a schematic diagram of a memory management architecture in a first state according to certain embodiments. Memory cache 502 may receive and store a first set of data production 506. Preferably simultaneously, the hard drive 504 may receive and store the same first set of data production 508. This first set of data production may be received from an external source.

Figure 5B:
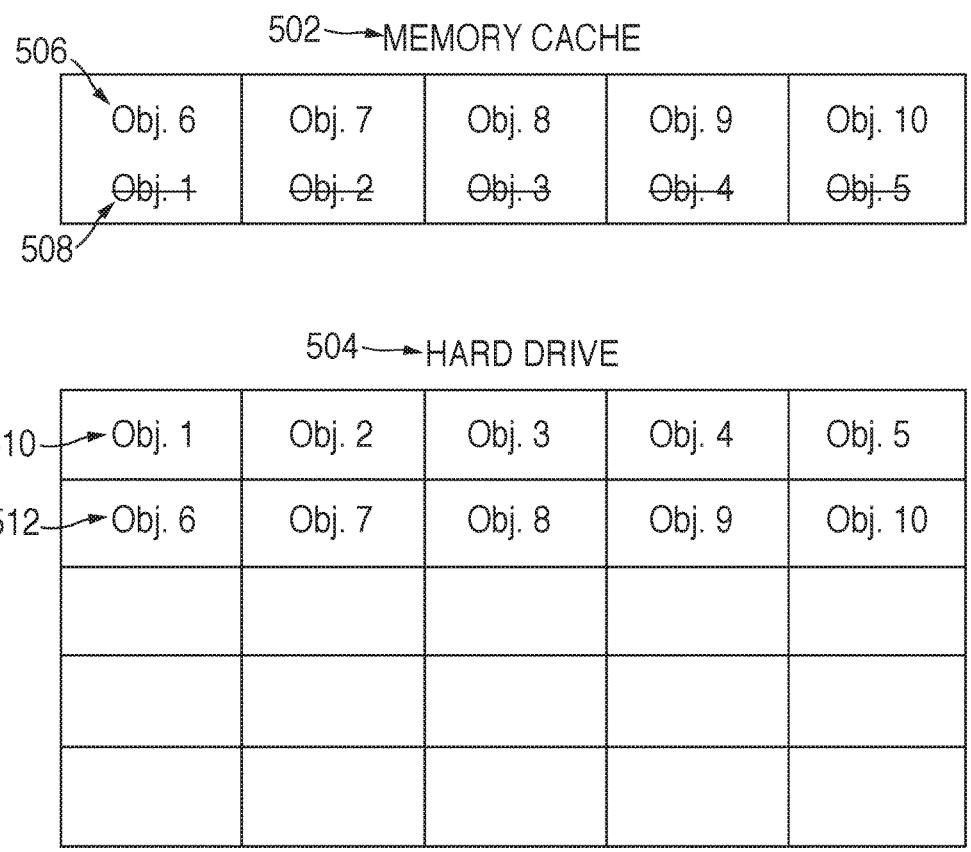
FIG. 5B shows a schematic diagram of a memory architecture in a second state according to certain embodiments.

FIG. 5B shows a schematic diagram of a memory management architecture in a second state according to certain embodiments. A memory management architecture in the second state, may receive a second set of data production as seen at 506. Upon receipt of the second set of data production 506 in memory cache 502, the second set of data production may overwrite the first set of data production 508.

Preferably simultaneously, in the second state, the hard drive 504 may be configured to receive and store the second set of data production 512. Hard drive 504 may store the second set of data production 512 while maintaining the first set of data production 510.

Figure 5C:
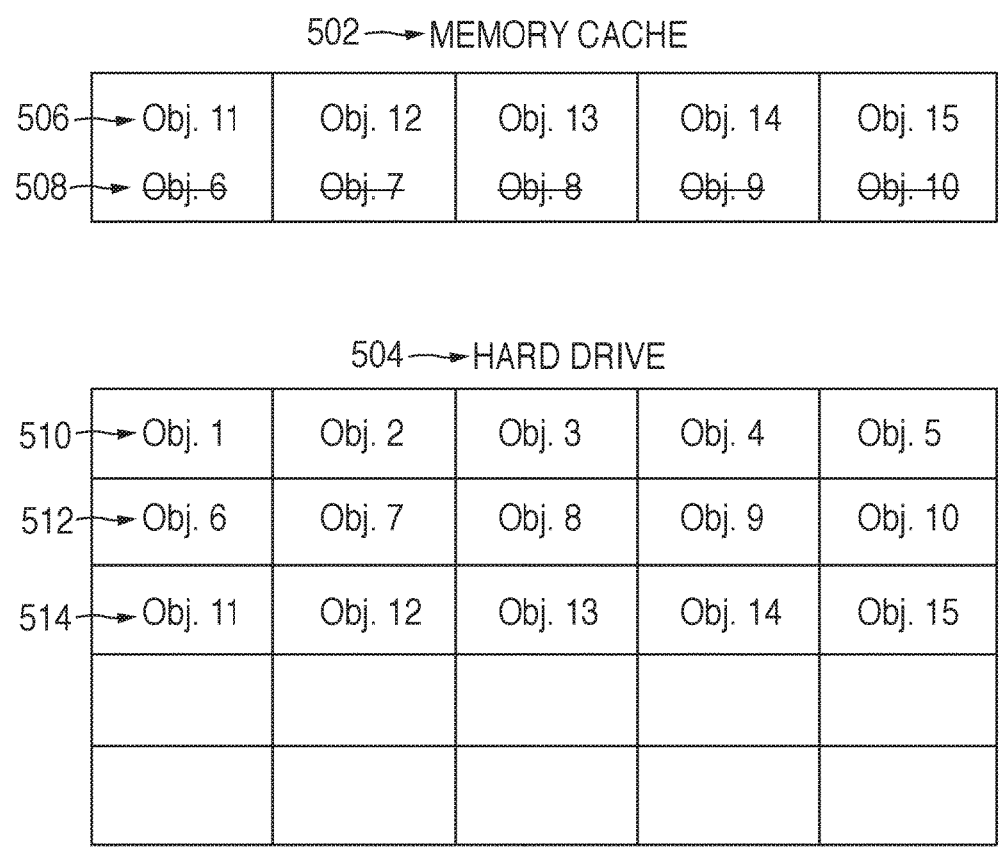
FIG. 5C shows a schematic diagram of a memory architecture in a third state according to certain embodiments.

FIG. 5C shows a schematic diagram of a memory management architecture in a third state according to certain embodiments. In the third state of a memory management architecture, the memory cache 502 may receive and store a third set of data production 506 from an external source. The third set of data production 506 may overwrite the second set of data production as seen at 508.

Hard drive 504 may preferably simultaneously receive and store the third set of data production 514 while maintaining the first set of data production 510 and the second set of data production 512.

Management of the memory in this method may increase the speed of testing diagnostics because such an architecture transitions from state to state without the need for reading or writing from the hard drive to the cache or from the cache to the hard drive and thereby may allow for a more efficient testing setting and process.

Figure 6A:
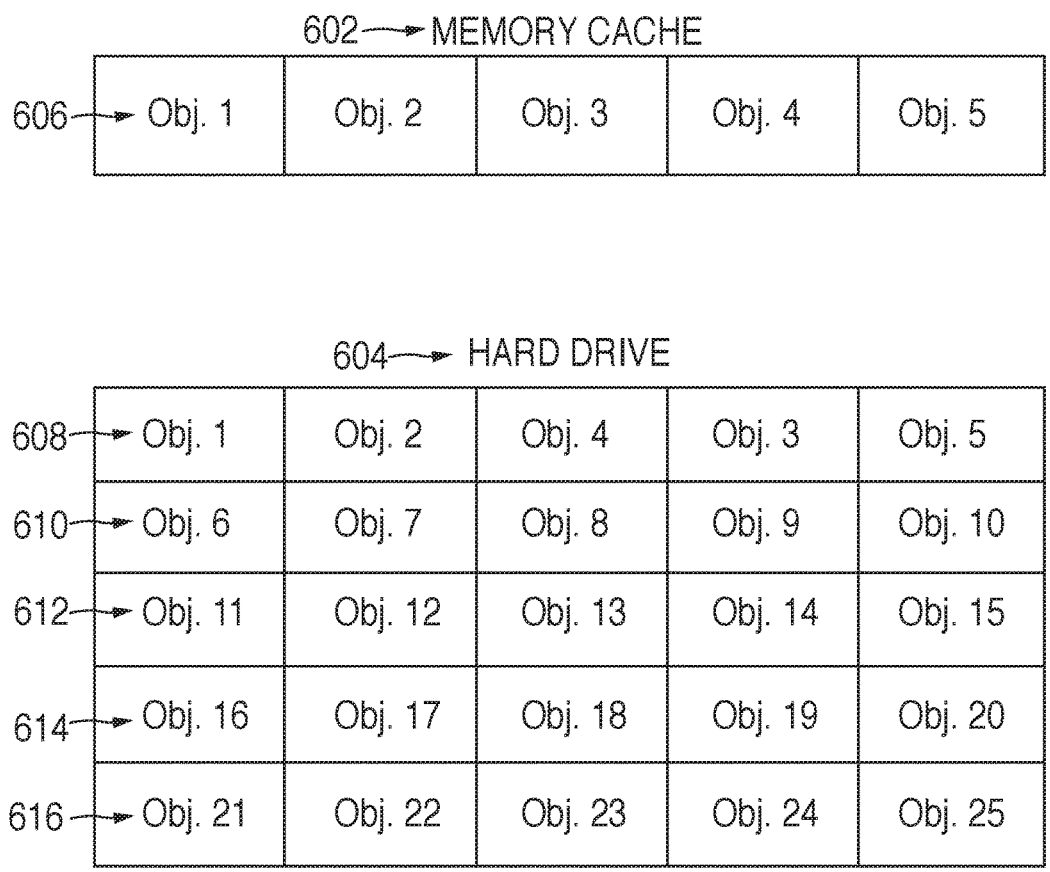
FIG. 6A shows another schematic diagram of a memory management in a first state according to another embodiment.

FIG. 6A shows another schematic diagram of a memory management architecture in a first state according to another embodiment. In this first state of a memory management architecture, a first subset 606 of a high-volume data production may be received and stored on the memory cache 602. Preferably simultaneously, the complete set of high-volume data production 608-616 may be received and stored on the hard drive 604.

Figure 6B:
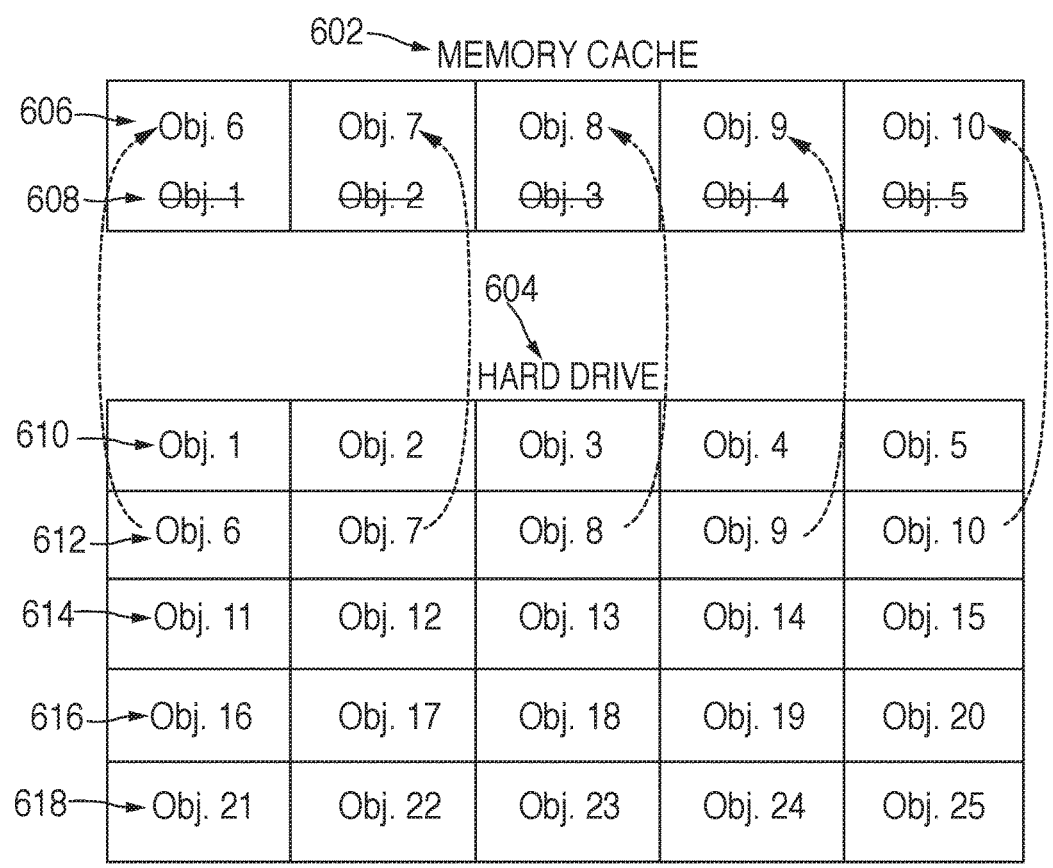
FIG. 6B shows another schematic diagram of a memory management in a second state according to another embodiment.

FIG. 6B shows another schematic diagram of a memory management architecture in a second state according to another embodiment. In the second state of the memory management architecture, the memory cache 602 may be configured to receive a second subset of high-volume data production 606 from the complete set of high-volume data production 610-618 stored on the hard drive 604. The second subset may be stored on the memory cache 602 and may overwrite the first subset of memory cache 608. These methods of memory management may avoid the need to write from the cache to the hard drive and as a result may increase the speed of the testing diagnostics.

Thus, methods and apparatus for providing memory management architecture for use with a diagnostic tool have been provided. Persons skilled in the art will appreciate that the present invention can be practiced by other than the described embodiments, which are presented for purposes of illustration rather than of limitation. The present invention is limited only by the claims that follow.

What is claimed is:

1. A memory management architecture for administrating a diagnostic testing tool comprising:
   a memory cache and a hard drive, said memory cache and said hard drive configured to:
   receive simultaneously, a first set of production data, said receiving simultaneously reducing processing time, said first set of production data which, comprises non-transitory computer-readable spreadsheet files, each of said spreadsheet files comprising an associated spreadsheet file format;
   store said first set of production data;
   a diagnostic tool for data analysis of said first set of production data stored in said memory cache, said diagnostic tool configured to:
   generate a field list from said spreadsheet files, each member of said spreadsheet files comprising a file message format type associated with an individual spreadsheet file;
   analyze said generated field list for errors and/or omissions;
   generate a data analysis summary report based on the analysis of said first set of production data;
   said memory cache and said hard drive further configured to receive simultaneously, a second set of production data, said second set of production data which comprises a second set of non-transitory computer-readable spreadsheet files, each of said second set of spreadsheet files comprising an associated spreadsheet file format;
   wherein, said second set of production data in said memory cache overwriting said first set of production data stored in said memory cache and said second set of production data being stored in said hard drive while maintaining said first set of production data in said hard drive;
   said diagnostic tool further configured to:
   generate a second field list from said second set of spreadsheet files, each member of said second set of spreadsheet files comprising a file message format type associated with an individual spreadsheet file;
   analyze said second generated field list for errors or omissions;
   generate a data analysis summary report based on the analysis of said second set of production data.

2. The architecture of claim 1, further comprising, prior to analyzing said generated field list, specifying an amount of field types to test from the plurality of fields.

3. The architecture of claim 2 wherein said specifying is user-defined or system set.

4. The architecture of claim 1, further comprising, prior to analyzing said generated field list, specifying specific field types for testing from the plurality of fields.

5. The architecture of claim 4 wherein said specifying is user-defined or system set.

6. The architecture of claim 1, further comprising, prior to analyzing of said generated field list, selecting a specific set of data entries from a plurality of data entries included in the generated field list for analysis by means of selecting a start point of said data entries and an end point of said data entries.

7. The architecture of claim 6 wherein said specifying is user-defined or system set.

8. The architecture of claim 6, wherein, generating a data analysis summary report, said generating based on said specified set of data entries selected via a start point and an end point.

9. The architecture of claim 1, wherein the generating of a data analysis summary report, said generating based on said specified number of fields and/or said specified field types.

10. The architecture of claim 1, wherein said diagnostic tool configured to handle a variety of format types and upon said diagnostic tool determining said file format type, displaying said production data in accordance with said file format type.

11. The architecture of claim 10, wherein the generating of a data analysis summary report comprises generating in accordance with said file format type.

12. The architecture of claim 1, wherein said file message format type associated with the spreadsheet file comprises at least one of file types SWIFT, XML, and/or FIX.

13. A memory management architecture for administrating a diagnostic testing tool comprising:
- a hard drive, said hard drive configured to receive, a high-volume set of production data, said high-volume set of production data comprising non-transitory computer-readable spreadsheet files, each of said spreadsheet files comprising an associated spreadsheet file format;
- a memory cache, said memory cache configured to receive from said hard drive a first subset of said high-volume set of production data, said first subset of said high-volume set of production data stored on said memory cache;
- a diagnostic tool for data analysis of said first subset of production data stored in said memory cache, said diagnostic tool configured to:
- generate a field list from said spreadsheet tiles, each member of said spreadsheet files comprising a file message format type associated with an individual spreadsheet file;
- analyze said generated field list for errors and/or omissions;
- generate a data analysis summary report based on the analysis of said first subset of production data;
- said memory cache further configured to receive from said hard drive, a second subset of production data, said second subset being retrieved from said high-volume set of production data stored on said hard drive, said second subset being different from said first subset;
- following retrieval, said second subset being stored on said memory cache, said second subset of production data which comprises a second subset of non-transitory computer-readable spreadsheet files, each of said second subset of spreadsheet files comprising an associated spreadsheet file format;
- the retrieval of said second subset of production data in said memory cache to overwrite said first subset of production data stored in said memory cache;
- said diagnostic tool for data analysis of said second subset of production data stored in said memory cache, said diagnostic tool configured to:
- generate a field list from said spreadsheet files, each member of said spreadsheet files comprising a file message format type associated with an individual spreadsheet file;
- analyze said generated field list for errors or omissions;
- generate a data analysis summary report based on the analysis of said first subset of production data.

14. The architecture of claim 13, further comprising, prior to analyzing said generated field list, specifying an amount of field types to test from the plurality of fields.

15. The architecture of claim 14 wherein said specifying is user-defined or system set.

16. The architecture of claim 14, wherein the generating of a data analysis summary report, said generating based on said specified number of fields and/or said specified field types.

17. The architecture of claim 13, further comprising, prior to analyzing said generated field list, specifying specific field types for testing from the plurality of fields.

18. The architecture of claim 17 wherein said specifying is user-defined or system set.

19. The architecture of claim 13, further comprising, prior to analyzing of said generated field list, selecting a specific set of data entries from a plurality of data entries included in the generated field list for analysis by means of selecting a start point of said data entries and an end point of said data entries.

20. The architecture of claim 19 wherein said specifying is user-defined or system set.

21. The architecture of claim 19, wherein, generating a data analysis summary report, said generating based on said specified set of data entries selected via a start point and an end point.

22. The architecture of claim 13, wherein said diagnostic tool configured to handle a variety of format types and upon said diagnostic tool determining said file format type, displaying said production data in accordance with said file format type.

23. The architecture of claim 22, wherein the generating of a data analysis summary report comprises generating in accordance with said file format type.

24. The architecture of claim 13, wherein said file message format type associated with the spreadsheet file comprises at least one of file types SWIFT, XML, and/or FIX.

* * * * *